United States Patent [19]

Staehle

[11] 3,971,660

[45] July 27, 1976

[54] LITHOGRAPHIC PRINTING PLATE COMPRISING HYDROPHILIC LAYER OF POLYVINYLACETATE CROSSLINKED WITH TETRAETHYLORTHOSILICATE

[75] Inventor: Henry C. Staehle, Rochester, N.Y.

[73] Assignee: Eastman Kodak Company, Rochester, N.Y.

[22] Filed: July 17, 1975

[21] Appl. No.: 596,873

Related U.S. Application Data

[63] Continuation-in-part of Ser. No. 457,733, April 4, 1974, abandoned, which is a continuation-in-part of Ser. No. 289,387, Sept. 15, 1972, abandoned.

[52] U.S. Cl. .................................. 96/33; 96/296; 96/1 R; 96/86 R; 96/86 P; 101/455; 101/456; 101/460; 101/465
[51] Int. Cl.² ...................................... G03F 7/02
[58] Field of Search ............ 96/296, 33, 1 R, 86 R, 96/86 P; 101/455, 456, 460, 465, 149.2

[56] References Cited
UNITED STATES PATENTS

| 3,083,639 | 4/1963 | Thurlow | 101/465 |
| 3,110,596 | 11/1963 | Heiss et al. | 96/33 |
| 3,227,075 | 1/1966 | Guastella et al. | 101/460 |
| 3,552,316 | 1/1971 | Ormsbee | 96/33 |
| 3,582,328 | 6/1971 | De Haes et al. | 96/33 |
| 3,607,255 | 9/1971 | Back | 96/33 |
| 3,690,883 | 9/1972 | Hyland | 96/296 |

Primary Examiner—Edward C. Kimlin
Attorney, Agent, or Firm—Henry E. Byers

[57] ABSTRACT

A method of providing a printing plate comprises coating on a support a layer having a hydrophilic surface comprising the homogeneous reaction product of hydrolyzed polyvinyl acetate and hydrolyzed tetraethyl orthosilicate. The coating may also contain pigments such as titanium dioxide and the like. A printing plate is provided having a support having thereon a layer having a hydrophilic surface and over the layer a silver precipitating layer, preferably comprising nickel sulfide and silver iodide. An image is provided in the silver precipitating layer by diffusion transfer and treated with a thiol or similar sulfur-containing material to improve the ink-water balance of the plate.

16 Claims, No Drawings

LITHOGRAPHIC PRINTING PLATE COMPRISING HYDROPHILIC LAYER OF POLYVINYLACETATE CROSSLINKED WITH TETRAETHYLORTHOSILICATE

This is a continuation-in-part of U.S. Pat. application Ser. No. 457,733, now abandoned, filed Apr. 4, 1974, which is a continuation-in-part of U.S. Patent application Ser. No. 289,387, now abandoned filed Sept. 15, 1972.

BACKGROUND OF THE INVENTION

This invention is concerned with printing plates and their preparation. In one aspect, the invention relates to the formation of a lithographic surface using hydrolyzed polyvinyl acetate and hydrolyzed tetraethyl orthosilicate. Another aspect of this invention relates to lithographic plates and their formation by diffusion transfer.

It is known to obtain lithographic printing plates by using various surfaces on suitable supports for lithographic plates which are intended for a relatively short press life. Where only a few hundred copies are required, or even up to about 1,000 copies, it is quite common to use a paper printing plate. However, it has been desirable to improve the lithographic coating used on the paper surface in order to decrease scumming in the non-image areas, improve wearability on the press, reduce the tendency for blinding, etc.

Perkins U.S. Pat. No. 3,055,295 issued Sept. 25, 1962, describes a planographic printing plate having thereon a lithographic coating comprising a polymeric material and a mixture of pigments. The polymeric material requires a cross-linking agent such as dimethylol urea in order to provide a satisfactory lithographic layer. However, it has been desirable to obtain a lithographic surface which is self-hardening.

In a particularly useful method for providing a printing plate, a silver image is obtained by the photographic diffusion transfer process. A silver precipitating or nucleated surface is provided on a hydrophilic surface on which complexed silver halide is transferred from a developing silver halide emulsion. Hepher et al., U.S. Pat. No. 3,161,508, describes the preparation of an aluminum lithographic printing plate by diffusion transfer and discloses treating a silver image obtained by diffusion transfer to improve its affinity for greasy printing ink. However, the formation of a paper lithographic plate using conventional paper supports having thereon a hydrophilic surface such as a layer of a cross-linked polymeric binder has not been entirely satisfactory due to problems of slow inkup, blinding, etc.

Thurlow, U.S. Pat. No. 3,083,639, issued Apr. 2, 1963, describes a planographic printing plate having a paper support with a planographic layer thereon comprising an essentially non-aqueous solution containing silicate esters and their reaction products. A coating of hydrolyzed ethyl silicate in a solvent solution containing methyl ethyl ketone is coated on a support and, before dryin, can occur, a second solution containing alkaline agents; such as, ammonium, sodium, or barium hydroxide, is coated over the initial acidic layer. When the first coating is allowed to dry, it results in a hydrophobic layer.

Bechtold, U.S. Pat. No. 2,404,357, issued July 23, 1947, discloses an abrasion-resistant coating for methyl methacrylate polymer comprising partially hydrolyzed polyvinyl acetate and hydrolyzed ethyl silicate. The coating is heated at an elevated temperature (i.e. about 150°C) to cure the coating and bond the coating to the surface of methyl methacrylate polymer. However, the cured coating is hydrophobic.

Neither the Thurlow nor the Bechtold coatings meet the need of a hydrophilic polymeric pigmented layer having a surface which would have a desirable hardness, degree of affinity for water and would provide a good bond to a silver image obtained by the photographic diffusion transfer process or to hydrophilic coatings such as gelatin photographic coatings.

Accordingly, it has been desirable to provide an improved lithographic surface for preparation of lithographic plates especially by diffusion transfer, which would be hydrophilic with respect to an oleophilic image area, have good reproducibility, and which can be used as a surface for various types of oleophilic images.

SUMMARY OF THE INVENTION

The lithographic element of the invention comprises a support having thereon a layer having a hydrophilic surface. The layer comprises a hydrophilic, homogeneous reaction product of polyvinyl alcohol and hydrolyzed tetraethyl orthosilicate. Preferably, the layer also contains a pigment, such as titanium dioxide. In one embodiment, the support is paper having thereon a polyethylene coating which has been treated by corona discharge. In a preferred embodiment, a silver precipitating (nucleating) layer, such as a gelatin dispersion of nickel sulfide and silver iodide or the like, is located over the hydrophilic surface. An image is obtained on the precipitating layer by diffusion transfer by contacting it with an exposed silver halide emulsion in the presence of a silver halide developing agent and a silver halide solent.

However, an image may be obtained by other means, such as by a light-sensitive material, including silver halide diazo compositions, photoconductors, etc. A silver image is preferably treated with a solution of an organic compound containing an oleophilic group in the molecule and being a compound which when brought into contact with the silver at ordinary room temperature becomes integrated to the surface of and only in the region of the silver and thereby renders the surface of the silver oleophilic by virtue of the oleophilic groups so that greasy printing inks adhere thereto.

PREFERRED EMBODIMENTS

Hydrolyzed tetraethyl orthosilicate can be prepared by stirring about 2 parts by weight of tetraethyl orthosilicate with about 1 part by weight of 0.1 normal hydrochloric acid. The temperature rises spontaneously to a maximum of about 60°C within about 5 minutes. Stirring is discontinued and the solution is permitted to stand until used.

The amount of water typically used in the hydrolysis of the ethyl silicate is such that, as the ester progressively hydrolyzes and condenses into a polymer in the presence of suitable solvents, a single solution phase is maintained throughout the process. For example, the amount of water for the hydrolysis of the ethyl silicate can be about 1 part by volume to about 5 parts by volume ethyl silicate but considerably more water may be used. In a preferred embodiment, at least 20 percent by weight of water is used, based on the amount of ethyl silicate. From 20 percent to 100 percent by weight of water based on the amount of ethyl silicate is preferred.

A relatively high concentration of a hydrolysis catalyst is desirable for the hydrolysis of tetraethyl orthosilicate when an efficient common solvent for tetraethyl orthosilicate and the hydrolysis products is not present. This accelerates dissolution and prevents precipitation of silicic acid ($SiO_2.xH_2O$) due to a high degree of local hydrolysis and polymerization. For this reason, it is convenient to use 0.1 normal hydrochloric acid as the source of both water and catalyst. However, with efficient agitation, 0.01 normal hydrochloric acid may be used and, with an efficient common solvent present, such as ethanol, the reaction proceeds satisfactorily without the use of catalyst. Among the catalysts suitable for the hydrolysis reaction are the mineral acids, such as, hydrochloric, phosphoric, and sulfuric acid, and non-volatile organic acids, such as, oxalic and maleic, or even weaker or more volatile organic acids, such as, acetic and formic acids.

Hydrolyzed polyvinyl acetate, e.g., polyvinyl alcohol, is compatible with ethyl silicate hydrolyzed with up to 200 percent by weight of water. In a preferred embodiment, ethyl silicate hydrolyzed with 20 percent to 75 percent by weight thereof of water is most satisfactory.

The polyvinyl acetate described herein can be hydrolyzed to substantially complete hydrolysis. A wide variation in the relative viscosity of the polyvinyl acetate is permissible. However, it has been found that polyvinyl acetate, preferably hydrolyzed to the extent of 75 to 100 percent by weight when used in the coating solutions, is preferable.

The proportion of hydrolyzed polyvinyl acetate to hydrolyzed tetraethyl orthosilicate used may be varied widely. The mixture of polyvinyl alcohol and hydrolyzed tetraethyl orthosilicate forms a hydrophilic, homogeneous reaction product. In a preferred embodiment, 1 part by weight of hydrolyzed polyvinyl acetate to about 1 – 50 parts by weight of hydrolyzed tetraethyl orthosilicate, calculated as $SiO_2$, can be used, although, generally 1.5 to 9 parts by weight hydrolyzed tetraethyl orthosilicate to 1 part hydrolyzed polyvinyl acetate polymer will be used.

The coating is preferably pigmented with titanium dioxide of pigment size which typically has an average mean diameter of 0.3 micron and a range of about 0.1 micron to 0.6 micron. Apparently, the homogeneous mixture includes the titanium dioxide and may even react with it to form an interlocking network forming a very durable printing plate. Either rutile or anatase titanium dioxide can be used to provide a desirable white appearance to the lithographic layer. Clays, such as kaolin or china clays, may be used in place of titanium dioxide provided they are of small size. Other pigments which may be used include calcium silicate, barium sulfate, etc. and mixtures thereof.

The coating composition of the invention is coated using any satisfactory coating method.

Various supports may be used under the lithographic coating of this invention. However, a paper support is preferred. The paper can be any conventional cellulosic paper support including those prepared from cotton, linen and wood. (sulfate and sulfite pulp) and which supports are typical 5–60 pounds per 1000 square foot papers. The paper is preferably coated with a polymeric material in order to make it more resistant to wear on the press and also to prevent processing chemicals from being absorbed by the paper. Particularly useful polymeric materials are polyolefins such as polyethylene which is employed as a coating on the paper support. A polyolefin material which forms the surface can be coated over any support, typically at a thickness of about 0.3 to 5 mils. For instance, particularly useful polyolefin materials include the olefin homo- or copolymers prepared from alpha-olefins having 2–10 carbon atoms. A coating may be applied by extrusion or hot melt coating techniques, as latexes, as solvent coatings, etc. When the polyolefin is self-supporting, it can be of any convenient thickness.

In some instances it is desirable to incorporate in the polyolefin resin at least one pigment or dye, especially where a white background is desired. In a particularly useful embodiment, titanium dioxide is incorporated as a pigment in an amount of up to 25%, preferably 10–15% by weight of the resin. Other pigments or dyes which may be useful include those commonly known as pigments or dyes for polymeric materials.

The polyolefin surface can be given an additional treatment when the polyolefin material such as polyethylene is extruded but this is not necessary to this invention. Shortly after extrusion, the polymeric material is contacted against a chilled roll which may be glossy, preferably, or matte depending upon the desired finish. In another embodiment, the coating is placed on the support as a latex or solvent coating and then contacted against a hot glossy roll in order to provide a glossy or matte finish. This is particularly suitable when a latex coating has been applied or when the polymeric surface has been softened on the surface by contacting with a semisolvent solution which softens the surface of the coating. In still another embodiment a latex coating may be applied to a support after which the coated support is subjected to heat such as by hot air impinging on the surface or from infrared lamps directed to the surface.

The polymeric surface may be given a treatment to improve the hydrophilic character of the surface to improve adhesion, but this is not necessary. Typical treatments which are particularly suitable for use with hdyrophobic polyolefin polymers, such as polyethylene, include corona discharge radiation by ultraviolet light, etc.

The level of corona discharge or similar surface treatment of the polymeric surface can be measured by the contact angle obtained when a drop of distilled water is placed on a level sample of the polymeric coating. By projecting the image of the drop and sample on a suitable screen, and measuring the angle of a line tangent to the drop image at the point where the drop touches the polymeric sample, a contact angle is obtained which can be measured and utilized to determine the degree of hydrophilicity. Generally untreated polyethylene coated paper gives a contact angle of about 90°. A contact angle of preferably from about 40° to about 76° improves the adhesion of hydrophilic coatings and is highly desirable for coatings such as cellulose ester coatings, subbing coatings or the like. With polypropylene, the preferred contact angle is preferably less than 54° for subsequent coatings.

The coating of the invention has a contact angle as measured by water of from about 12° to about 40°.

Typical methods of treating polyethylene by corona discharge are disclosed in Traver U.S. Pat. No. 3,018,189 directed to methods for treating the surface of polyethylene with electrostatic discharges to change the surface properties of the polyethylene with respect to adhesion of materials coated thereon. British Patent Specification 715,915 issued to the Visking Corp., published Sept. 22, 1954 also discloses a method and apparatus for treating plastic structures with a corona discharge.

Another method of improving adhesion to a polyolefin coated surface is illustrated by Alsup U.S. Pat. No. 3,161,519 issued Dec. 15, 1964 in which colloidal silica is employed in a coating over the polyolefin surface. In the particular disclosure therein, a coating mixture containing colloidal silica is coated on untreated polyethylene coated paper and dried with hot air at about 150°F. A particularly useful coating composition is disclosed in Example 6 in which an acrylic resin is employed in the coating composition.

It will be appreciated that various layers of polymer may be coated on a support such as paper. In one embodiment, glasine paper is employed with polyolefin coated on each side followed by another sheet of glasine paper and an additional coat of polyolefin. The polyolefin may be coated on both sides of the paper support in order to improve the durability of the support and reduce the processing chemical absorption.

Cellulose esters may also be used for coating on a support such as paper and include cellulose esters which are obtained from organic acids having 2–4 carbon atoms including mixed esters such as cellulose acetate butyrate, cellulose acetate propionate and the like. Particularly useful esters are those of lower aliphatic, preferably monocarboxylic acids, such as cellulose acetate, cellulose triacetate, cellulose butyrate and the like. Typical cellulose ester formulations are described in Fordyce et al U.S. Pat. Nos. 2,492,977 and 2,492,978 issued Jan. 3, 1950, Fordyce et al U.S. Pat. No. 2,739,070 issued Mar. 20, 1965 and Fordyce et al U.S. Pat. No. 2,607,704 issued Aug. 19, 1952.

For use in a charge transfer process, an electrically conducting support is desirable. For instance, a coating of CuI can be deposited on a suitable support. Other conductive supports such as evaporated Ni, conductive carbon particles, conducting resins conducting paper, Al or Cu, etc., can be used. In the case of a simple receiver sheet (e.g., toner transfer receiver), a conductive support is not necessary and any conventional lithographic support will suffice with the coating of my invention thereon.

Inorganic, as well as organic photoconductors can be overcoated with the subject hydrophilic polymer layers of my invention to produce a direct imaging, light-sensitive plate. In both cases various interlayers or surface treatments may be required to improve overcoat adhesion, e.g., electron bombardment, inter or subbing layers such as polyvinylacetate, a vinylidene chloride-methyl acrylate-itaconic acid terpolymer and various other adhesion promoting polymers, or organo metallic adhesion promoters such as the tetralkyl orthotitanates.

It will be appreciated that other suitable supports may be used.

Precipitating agents which are particularly useful for use in the receiving sheet for use in a black and white diffusion transfer process include nuclei which are useful as precipitating agents with a silver halide complex, including all of those which are commonly useful in the diffusion transfer process. Nuclei which can be employed include silver precipitating agents known in the art such as sulfides, selenides, polysulfides, polyselenides, heavy metals, thiourea, stannous halides, heavy metal salts, fogged silver halide, Carey Lea silver, silver proteinate and complex salts of heavy metals with a compound such as thioacetamide, dithiooxamide and dithiobiuret. As examples of suitable silver precipitating agents and of image-receiving elements containing such silver precipitating agents, reference may be made to U.S. Pat. Nos. 2,698,237, 2,698,238 and 2,698,245 issued to Edwin H. Land on Dec. 28, 1954, U.S. Pat. No. 2,774,667 issued to Edwin H. Land and Meroe M. Morse on Dec. 18, 1956, U.S. Pat. No. 2,823,122 issued to Edwin H. Land on Feb. 11, 1958, U.S. Pat. No. 3,396,018 issued to Beavers et al Aug. 6, 1968 also U.S. Pat. No. 3,369,901 issued to Fogg et al Feb. 20, 1968 and U.S. Pat. No. 3,532,497 issued to Goffe Oct. 6, 1970. The noble metals, silver, gold, platinum, palladium, etc., in the colloidal form are particularly useful.

Noble metal nuclei are particularly active and useful when formed by reducing a noble metal salt using a borohydride or hydrophosphite in the presence of a colloid. The metal nuclei can be prepared in the presence of a proteinaceous colloid such as gelatin and coated on the receiving sheet. The same or a different colloid may be added if desired. It will be appreciated that the coating composition generally contains not only nuclei, but also reaction products which are obtained from reducing the metal salt.

It will also be appreciated that the nuclei or silver precipitating agent may be incorporated in the lithographic layer itself by adding a suitable silver precipitant to the coating composition including the silica, titanium dioxide, polymeric material, etc. By incorporating the silver precipitating agent in the coating composition itself, the hydrophilic polymers of my invention and silver precipitating material can be coated in one operation.

When a separate nuclei-containing layer is desired, various colloids can be used as dispersing agents or as binders for the precipitating agents in the receiving layer. Any suitable colloids can be used. Particularly useful colloids are hydrophilic colloids which are used for binders in silver halide emulsions. Advantageously, they are coated in a range of about 5–5000 mg/ft$^2$. Included among suitable colloids are gelatin, preferably coated at a level in the range of about 7–100 mg/ft$^2$, polymeric latices such as copoly(2-chloroethylmethacrylate-acrylic acid) preferably coated in the range of 15–350 mg/ft$^2$ in a polymeric vehicle containing two components (1) polyvinyl alcohol, and (2) interpolymer of n-butylacrylate, 3-acryloyloxypropane-1-sulfonic acid, sodium salt and 2-acetoacetoxyethyl methacrylate, in a preferred range of about 10–300 mg/ft$^2$.

In order to improve the coating properties of the colloid coating composition containing a silver precipitating agent, acyclic sulfobetaines as described in Ernst U.S. Pat. No. 3,280,179, issued Oct. 18, 1966 or in British Patent No. 1,159,825, issued to Eastman Kodak Co., can be added. In a preferred embodiment, high viscosity carboxy methyl cellulose is also incorporated.

It will also be appreciated that the precipitating agents can be formed in situ or can be applied by precipitating or evaporating a suitable precipitating agent on the surface of the hydrophilic colloid coating composition.

The receiving layers of my invention can also have therein particles such as silica, bentonite, diatomaceous earth such as kieselguhr, powdered glass, micro crystalline asbestos and fuller's earth. In addition, colloids and colloidal particles of metal oxides such as titanium dioxide, colloidal alumina, coarse aluminum oxide, zirconium oxide and the like may be used with the nuclei in the receiving layers.

In carrying out the diffusion transfer process, conventionally a silver halide emulsion is exposed to a light image after which it is contacted with a silver halide developing agent containing a silver halide complexing agent. The exposed emulsion is developed in the light struck areas and the unexposed silver halide is complexed with the silver halide complexing agent after which the emulsion is contacted against a receiving sheet and the complex silver halide diffuses imagewise to the receiving sheet containing a silver precipitant.

Silver images produced photographically are customarily treated with an oleophilic compound which absorbs itself to the silver of the image area and improves greasy printing ink-water differential. Particularly useful compounds are disclosed in Hepher et al U.S. Pat. No. 3,161,508 which specify various sulfur containing compounds which are particularly useful. In U.S. Pat. No. 3,099,209 issued July 30, 1963 to Damschroder et al certain specific sulfur containing compounds are also disclosed. In U.S. Pat. No. 3,083,097 issued Mar. 26, 1963 to Lassig et al, it is disclosed that silver images produced photographically can be converted by means of a bleaching or coating process or by reducers or intensifiers with the aid of oxidation baths into sparingly soluble heavy metal and/or silver salt images. In this proces potassium ferricyanide is used, for example, for oxidizing the silver, whereby the silver image is converted into a ferricyanide which is precipitated partly as insoluble silver ferricyanide and partly as insoluble ferricyanide of other metals which are added to the baths in the form of salts.

Silver halide developing agents used for initiating development of the exposed sensitive element can be conventional types used for developing films or papers with the exception that a silver halide solvent or complexing agent such as sodium thiosulfate, sodium thiocyanate, ammonia or the like is present in the quantity required to form a soluble silver complex which diffuses imagewise to the receiving support. Usually, the concentration of developing agent and/or developing agent precursor employed is about 3 to about 320 mg/ft$^2$ of support.

Developing agents and/or developing agent precursors can be employed in a viscous processing composition containing a thickener such as carboxymethyl cellulose or hydroxyethyl cellulose. A typical developer composition is disclosed in U.S. Pat. No. 3,120,795 of Land et al issued Feb. 11, 1964.

Developing agents and/or developing agent precursors can be employed alone or in combination with each other, as well as with auxiliary developing agents. Suitable silver halide developing agents and developing agent precursors which can be employed include, for example, polyhydroxybenzenes, alkyl substituted hydroquinones, as exemplified by t-butyl hydroquinone, methyl hydroquinone and 2,5-dimethylhydroquinone, catechol and pyrogallol; chloro substituted hydroquinones such as chlorohydroquinone or dichlorohydroquinone; alkoxy substituted hydroquinones such as methoxy hydroquinone or ethoxy hydroquinone; aminophenol developing agents such as 2,4-diaminophenols and methylaminophenols.

Photographic silver halide emulsions, preparations, addenda, processing and systems may be used as disclosed in paragraphs I through XVIII and XXIII in *Product Licensing Index*, December, 1971.

Silver halide emulsions employed with lithographic layers and elements of this invention either in integral products or on separate supports can contain incorporated addenda, including chemical sensitizing and spectral sensitizing agents, coating agents, antifoggants and the like. They can also contain processing agents such as silver halide developing agents and/or developing agent precursors. Of course, the processing agents can be incorporated in a layer adjacent to the silver halide emulsion if desired.

Integral elements may be prepared by coating a silver halide emulsion over the nucleated layer or over the lithographic layer containing the silver precipitating agent. The silver halide emulsion is coated over the layer comprising a colloid material which can be easily removed from the lithographic layer after a silver image has been formed on the lithographic layer or in the lithographic layer. Typical diffusion transfer integral processes and products are described in U.S. Pat. No. 3,020,155 issued Feb. 6, 1962 to Yackel et al, U.S. Pat. No. 2,563,342 issued to Land, Aug. 7, 1951, U.S. Pat. No. 2,692,830 issued Oct. 26, 1954 to Land, British Patent 746,948 issued to Levenson et al, published Mar. 21, 1956, British Patent 878,064 issued to Ilford, published Sept. 27, 1961 and U.S. Pat. No. 3,186,842 issued to DeHaes et al June 1, 1965.

In an electrographic process, the end product is an electrostatic charge pattern which is made visible via the attraction of charged marking particle (toner). Attempts to attach and hold the toner particles to the hydrophilic lithographic printing plate surface are difficult and press operations and undercutting result in partial or complete loss of the oleophilic image. The combination of titanium dioxide and hydrolyzed tetraethyl orthosilicate with polyvinyl alcohol provides a highly crosslinked long run lithographic printing plate with excellent toner adhesion and plate durability. Receiver sheets utilized in electrostatic charge transfer processes, overcoated with such a formulation, exhibit excellent charge holding properties.

The following examples are included for a further understanding of the invention.

Example 1 - Preparation of Hydrolyzed Tetraethyl Orthosilicate

Tetraethyl orthosilicate (Eastman Chemical 4203) is mixed with water in an amount of about 10 percent of the volume of the silicate. About 2 percent of ethyl alcohol (95 percent) is added. At this state there is incomplete homogeneity between the water and the tetraethyl orthosilicate. A small amount of concentrated hydrochloric acid, one drop per cc of solution is added and the solution is stirred until the entire mixture is homogeneous. At this stage, further water is added without permanent phase separation. This solution remains clear and homogeneous. It is compatible with polyvinyl alcohol and with titanium oxide in the form of a water dispersion.

Example 2 - Nucleating Composition

A nucleating composition is prepared by mixing two solutions prepared as follows:

| Solution A | |
|---|---|
| Tetraethyl orthosilicate hydrolyzed according to Example 1 | 5cc |
| Polyvinyl alcohol (Elvanol 52–22, 98 percent hydrolyzed polyvinyl acetate, 10 percent solution in water | 5cc |
| Water | 20cc |
| Solution B | |
| Boric acid (5 percent solution in water) | 10cc |
| Silver proteinate (mild) - Mallinckrodt - 5 percent in water | 5cc |
| Water | 20cc |

Solution B is added to Solution A in sufficient amount to cause slight precipitation. The resulting composition is relatively stable on standing.

A suitable hydrophilic surface is prepared for the photographic silver chemical transfer process by applying the above nucleating solution uniformly over the surface of a support. The area is dried at a temperature of about 70°C and has a contact angle measured by water of about 12°. A temperature range of 15°C to 80°C is preferred. The nucleated layer is then used according to the chemical transfer process in which a light-sensitive negative is exposed, brought into intimate contact with the receiving layer in the presence of a suitable solvent and developer, and separated after 30 seconds transfer time. The transferred image is treated with an image conditioner described in Hepher et al, U.S. Pat. No. 3,161,508, issued Dec. 15, 1964. The plate is then put on a lithographic plate press and used for printing.

Example 3

A plate as described in Example 2 is prepared and used as a control. Similar specimens are heated at a temperature from 100° to about 110°C at various times. An image is formed thereon and the plates run on a printing press to determine the hydrophilic nature of the coating.

| Time | Scumming |
|---|---|
| Control | no noticable scum |
| 2 minutes | slight scum |
| 5 minutes | slight scum |
| 15 minutes | heavy scum |
| 30 minutes | heavy scum |
| 45 minutes | heavy scum |

It is seen from the above results that heating the hydrophilic coating increases the amount of ink affinity and tends to make the coating hydrophobic or oleophilic.

Example 4

A solution is made by mixing 10 ml. of hydrochloric acid solution (made by diluting 5 ml. concentrated hydrochloric acid and 250 ml. of water), with 10 ml. of ethyl alcohol (95 percent) and 15 ml. of tetraethyl orthosilicate (Eastman Chemical No. 4203). This mixture turns cloudy initially but finally clears. Then 20 ml. of water and 105 ml. of tetraethyl orthosilicate are slowly added to the first mixture with the aid of mechanical agitation. The resultant solution is allowed to stand overnight at room temperature to complete the hydrolysis.

One gram of the above solution is mixed with 4.0 gram of a 5 percent by weight aqueous solution of poly(vinylalcohol) (DuPont Elvanol 70-05, 95 percent hydrolyzed). A coating at 0.002-inch wet thickness is made of this solution on subbed poly(ethylene teraphthalate) support. The poly (ethylene teraphthalate) film is subbed with a vinylidene chloride (80 percent by weight)--acrylonitrile (14 percent by weight)--acrylic acid (6 percent by weight) terpolymer. The subbed and coated film is dried for 5 minutes in an oven at 105°C. The resulting hydrophilic coating is flexible and non-tacky.

Samples of the same polyvinyl alcohol solution are also prepared containing colloidal silica and coated on the subbed poly(ethylene-terephthalate) film. Electron micrographs are made of the films containing the colloidal silica as well as the films containing the hydrolyzed tetraethyl orthosilicate in order to establish the existance of discrete particles and to determine their particle size.

No particulate matter is found in the hydrolyzed tetraethyl orthosilicate coating. However, particulate matter is found in the colloidal silica samples. The average particle size appears to be around 100 A.

A solution of hydrolyzed tetraethyl orthosilicate and polyvinyl alcohol as disclosed in Example 3 is pigmented with titanium dioxide and coated on polyethylene coated paper. Over this layer is then coated a subbing layer comprising the following:

10 g polyvinylpyrrolidone Type NP-K30 (GAF)
10 g of an antioxidant
3 l ethanol

This mixture is coated at about 1–1.5 cc per square foot. Over this is coated a layer of a light-sensitive polymer composition having the following formulation:

| | |
|---|---|
| Light-sensitive polyester prepared by condensing 100 mole percent p-phenylenediethoxyacrylate with 100 mole percent 1,4-di β-hydroxyethoxycyclohexane | 4.00 g |
| (2-Benzoylmethylene)-1-methyl-β-naphthothiazoline | 0.32 g |
| Benzoic acid | 0.16 g |
| Hydroquinone | 0.08 g |
| Monochlorobenzene | 100.00 ml |
| Pigment (Heliogen Blue K, C.I. Pigment Blue 15) | 0.80 g |

The plate is dried, exposed to insolubilizing radiation through a negative and developed by swabbing with the following developer composition:

| | |
|---|---|
| 4-Butyrolactone | 500.0 ml |
| Triethanolamine | 50.0 ml |
| Glycerol | 50.0 ml |
| Methyl abietate | 5.0 ml |
| Hydrogenated wood rosin (Staybelite resin, Hercules Powder Co.) | 0.5 g |
| Wetting agent (Zonyl A, DuPont) | 4.5 ml |

The plate is cleanly developed by swabbing action without an appreciable leaching out of the pigment from the printing areas. The plate is treated with a desensitizing formulation containing gum arabic. When the plate is run on a lithographic printing press, good results are obtained.

Example 5

A printing plate is formed for use with the diffusion transfer process having the following composition:

| | |
|---|---|
| 25 cc | hydrolyzed tetraethyl othosilicate |
| 50 cc | 5 percent ascorbic acid (in water) |
| 250 cc | polyvinyl alcohol (Gelvatol 20-30, 50 g/l, 95 percent hydrolyzed) |

-continued

| | |
|---|---|
| 25 cc | aluminum sulfate (25 g/l of water) |
| 350 cc | aqueous dispersion of colloidal silver |
| 5 cc | 0.1 percent solution sodium borohydride |

The above solution is coated at about 2 cc per square foot on a polyethylene paper support, dried and used in the photographic silver transfer process to form a silver image in the litho layer. The resulting plate is treated as in Example 1 and put on a lithographic printing press. Satisfactory results are obtained.

Example 6

A solution of hydrolyzed tetraethyl orthosilicate and polyvinyl alcohol as disclosed in Example 3 is pigmented with titanium dioxide and coated on polyethylene coated paper.

This layer is overcoated with light-sensitive coating of a composition as described in Example I of U.S. Pat. No. 2,852,379, issued Sept. 16, 1958. The dry coverage of the light-sensitive resin is 85 mg. per square foot.

Thereafter, the plate is contact-exposed through a line negative for 45 seconds to a carbon lamp at a distance of 5 feet, swab-developed with a 60-40 mixture, by parts, of a Stoddard solvent and cyclohexanol, treated with a Gum Arabic desensitizer, and printed on a conventional offset lithographic press. Five hundred reproductions of excellent quality are obtained.

Example 7

Example 6 is essentially repeated with the replacement of the light-sensitive resin by a light-sensitive polycarbonate comprising the product of a condensation reaction between 0.11 mole bisphenol "A", 0.142 mole divanillal cyclopentanone and 0.30 mole phosgene as described in Canadian Patent 696,997. The results obtained are similar to those obtained with the plates described in Example 6.

Example 8

Example 6 is essentially repeated except that the hydrophilic, polyvinyl alcohol-hydrolyzed silicate ester layer is overcoated at a wet coverage of 7 ml. per square foot with a fine-grain photographic silver halide emulsion prepared by combining the following portions:

Silver chloride emulsion containing 200 grams of gelatin per silver mole which contains 1 mole of silver for 4.25 kilograms of emulsion -- 8.5 grams
4-phenylcatechol dispersion containing 50 grams of 4-phenylcatechol and 50 grams of gelatin per 700 grams total weight -- 28.0 grams
15 percent aqueous saponin solution -- 1.0 ml.

When dry, each of the silver halide emulsion layers contains per square foot:

| | |
|---|---|
| Silver | 130 mg. |
| 4-phenylcatechol | 123 mg. |
| Gelatin | 370 mg. |

The coating is exposed to a high-contrast line negative and activated for 15 seconds in a 15 percent aqueous $K_2CO_3$ solution at a temperature of 22.2°C. The unexposed, and consequently unhardened areas of the emulsion, are then washed away with a spray of tap water at a temperature of 40.5°C. Having been dried, the coated side of each plate is swabbed with an image conditioner disclosed in British Patent No. 934,691 to improve ink receptivity of the unremoved colloidal image portions. The copies obtained by printing the incubated samples are excellent reproductions of the originals.

Example 9

A positive working lithographic plate can be prepared using the support of my invention either by using a reversal type photographic emulsion or by using two light-sensitive layers having different photographic speeds. If the top layer has greater sensitivity to light than the underlying layer, it may be separately exposed to a positive image, processed and that resultant image may be used as a negative and the exposure of the underlying layer whose sensitivity is such that it is unaffected by the exposure used to form the image in the top layer. A positive working plate based on this latter construction is prepared using the light-sensitive plate prepared in Example 7. The support with the layer having a hydrophilic surface and light-sensitive layer is coated with a camera speed silver halide emulsion of the type described in Example I of U.S. Pat. No. 2,596,756. The plate is exposed in a reversing camera to a line image for a short exposure. The exposed plate is activated in a caustic solution for 1½ minutes. The plate is rinsed with a water spray at 43°C and air dried. At this stage, the plate contains a dense silver image in slight relief on top of the light-sensitive polymer layer. It is re-exposed for 1 minute, 20 inches from a 300-watt photo-flood lamp. The plate is further processed as in Example 7. The silver halide image and the unexposed image-forming polycarbonate layer are removed. Only the light-hardened areas which are ink receptive remain on top of the hydrophilic, polyvinyl alcohol-hydrolyzed tetraethyl ortho-silicate layer. Thus a positive working plate results. The plate is de-sensitized and several hundred good impressions are made.

Example 10

A diazo resin is prepared by mixing 34 grams p-diazodiphenyl amine sulfate-zinc chloride double salt with 135 grams concentrated sulfuric acid which has been cooled to a temperature of −10°C. The mixture is agitated while the temperature is maintained at less than 3°C while 3.25 grams paraformaldehyde, and 6.05 grams anhydrous cadmium chloride are added. The viscosity increases over a period of approximately one-half hour and the mixture becomes homogeneous. The mixture is then poured over 150 grams of ice and stirred until the ice melts, the yellow precipitate is filtered, redissolved in water and reprecipitated into two liters of isopropyl alcohol, filtered and dried under a vacuum in the dark. Twenty-eight grams are obtained. This resin is a stabilized diazo resin.

The treated element of Example 6 is then sensitized by coating the layer of my invention having a hydrophilic surface with a dilute, 2 percent aqueous solution of diazo resin and dried. When exposed at approximately 24 inches through a negative with a high intensity 220 volt carbon arc in a NuArc Printer, the exposed portions are hardened.

The unexposed portions of the diazo resin are removed by washing with water. The image is then lacquered with a commercially available image lacquer.

The plate is then put on the lithographic printing press and produces 900 satisfactory copies.

Example 11 - Pigment/Binder Ratios

The following solutions were prepared.

Solution A - is prepared by adding about 4 g of $NH_4OH$ (28% by weight solution) per 100 g of polyvinylacetate-co-crotonic acid.

Ammonia is then added to distilled water, first, and the polymer added slowly with good agitation at 22°C until solution starts to thicken. This is stirred an additional 30 minutes at 45°C and allowed to cool to room temperature.

Solution B - Pre-dispersed titanium dioxide is prepared by the addition of titanium dioxide pigment to distilled water. The concentration is 55% by weight of the titanium dioxide.

Solution C - Polyvinyl alcohol (98% hydrolyzed polyvinyl acetate), 5% by weight in distilled water.

Solution D - Hydrolyzed tetraethyl orthosilicate.
10 g of dil. HCl (2 cc conc. HCl/100 cc distilled $H_2O$)
8 g of 95% Ethanol
15 g of tetraethyl orthosilicate To the above is added with good stirring, 100 g of tetraethyl orthosilicate and 20 g of distilled water in four equal portions each; alternating water then orthosilicate, etc. The final product should be crystal clear. This should be allowed to stand several hours before use. The available silica for the above solution, calculated as $SiO_2$, is 21.7%. The polyvinyl alcohol forms a homogeneous reaction product with the hydroylzed tetraethyl orthosilicate. The hydrolyzed orthosilicate appears to react with both the polyvinyl alcohol and the titanium dioxide to form a three-dimensional homogeneous network.

The following plates are capable of use as electrostatic charge transfer or toner transfer receiver sheets.

To 10 g of Solution C is added 0.08 g of 10% by weight polyethylene glycol alkyl aryl ether wetting agent (in $H_2O$), 0.75 g of Solution D (diluted to ½% by weight with isopropanol), varying amounts of Solution B, as described below, and 0.75 g of isopropanol. These compositions are dispersed and overcoated (0.002-inch wet thickness) on a conductive poly(ethylene terephthalate) support [(12 mg/ft² CuI) overcoated with 0.9 g/ft² of an insulating layer (Solution A)]. Each is cured at about 120°C for 5 minutes to form a receiver sheet.

An electrostatic charge transfer image is prepared by charging the samples with a negative corona to 800 volts placing a roughened transparent organic photoconductor in face-to-face contact with the receiver sheet and impressing (+) 1600 volts across the photoconductor while keeping the receiver sheet at ground. A positive image transparency is placed over the back of the photoconductor and this sandwich configuration exposed through the back of the photoconductor, separated, and the resultant electrostatic charge pattern on the receiver sheet developed with an electrostatic dry toner.

The image is fused at about 120°C for 1 to 2 minutes and placed on a lithographic printing press.

| g of 55% Solids Solution B | Pigment/ Binder | Press Results |
| --- | --- | --- |
| 0 | 0 | Toner wore off by 130 prints |
| 0.91 | 1/1 | Slight toner wear by 50 prints - gets worse. |
| 1.82 | 2/1 | Excellent, no apparent image or plate wear up to 1000 copies |
| 2.73 | 3/1 | |
| 3.64 | 4/1 | |
| 4.55 | 5/1 | |
| 5.45 | 6.1 | |
| 6.36 | 7/1 | |
| 7.28 | 8/1 | ↓ |

The above pigmented plates show no noticeable sign of image or plate wear at pigment-to-binder ratios of 2/1 and greater. Runs are stopped at 1000 prints.

The unpigmented sample shows toner pick-off from the beginning and loses all of its toned image by print No. 130. The 1/1 ratio shows slight toner pick-off by 50 prints and gets progressively worse.

Optimum pigment-to-binder ratio is from about 2/1 or greater. The Pigment/Binder ratios are stopped at 8.1. However higher ratios can be used.

Example 12 - Effect of hydrolyzed tetraethyl orthosilicate concentration.

The following plates are capable of use as a electrostatic charge transfer or toner transfer receiver sheets.

To 10 g of Solution C is added 0.08 g of 10% by weight polyethylene glycol alkyl aryl ether wetting agent, ($H_2O$), 3.64 g of Solution B and the following amounts of hydrolyzed tetraethyl orthosilicate (prepared by diluting Solution D to 5% by weight with isopropanol). The above composition is dispersed and enough isopropanol added (as a coating aid) until the final concentration of isopropanol was 1.5 g per sample.

Each sample is coated (0.002-inch wet thickness) on the conducting support of Example 11, and cured at 120°C for about 5 minutes.

An image is prepared on each by merely writing on the surface with a permanent marking pen (a marking dye in a dilute polymeric binder which is a very thin layer and will readily show any wear or undercutting). The following are run on a lithographic printing press with the following results:

| Sample No. | g of 5% Solution D | % $SiO_2$ Based on Dry wt. of C Present | Press Results |
| --- | --- | --- | --- |
| 1 | 0 | 0 | Marker wore off in 35 prints. |
| 2 | 0.05 | 0.5 | Slight marker wear after 130 prints. |
| 3 | 0.075 | 0.75 | Little to no wear up to 1000 prints. |
| 4 | 0.1 | 1.0 | No wear - Excellent plate up to 1000 prints. |
| 5 | 0.15 | 1.5 | |
| 6 | 0.2 | 2.0 | |
| 7 | 0.25 | 2.5 | |
| 8 | 0.3 | 3.0 | ↓ |
| 9 | 0.40 | 4.0 | |
| 10 | 0.5 | 5.0 | Very sl. background |

Markings readily wear off from the uncrosslinked plate. The crosslinked plates shows little or no signs of image or plate wear, depending on the degree of crosslinking. To test the press latitude of the plates, the fountain solution is completely discontinued to allow the plate to ink solid (repeated 3 times). Once the fountain solution is continued, each plate recovers within a very short number of prints (Except No. 10) giving a clean background. Plate No. 10 appears to be near the maximum amount of desired crosslinking concentration, as it was somewhat slower to recover and shows slight background spots.

The ratio of crosslinking to polymer appears to vary greatly with pigment-to-binder ratio, increasing as one increases the amount of $TiO_2$ added. Apparently, some of the crosslinker is absorbed directly on the $TiO_2$ particle and may even react with it to form an interlocking SiO + TiO network forming a very durable plate.

Example 13 - Preparation of toner imaged printing plates.

Toned electrostatic charge patterns are prepared similar to those in Example 11 by the charge transfer method and by using the plate as a simple toner receiver sheet by charging it to (−) 1000 volts and placing it in intimate contact with a reusable photoconductor element which has been charged negatively, exposed in an imagewise fashion, and developed using a positively charged dry toner.

The toner is transferred to the receiver sheet and fused. The resultant elements form useful printing plate.

Example 14 - Dry transfer of a photocrosslinking polymer.

A photocrosslinkable polymer of the type described in Alsup and Guevara, U.S. Pat. No. 3,703,373, issued Nov. 21, 1972, is utilized in place of the grained aluminum surface utilized in Example 6 of U.S. Pat. No. 3,703,373.

A pigmented photocrosslinkable element, poly(pentamethylene-bis-p-phenylene diacrylate) co azelate on a poly (ethylene terephthalate) support is imagewise contact exposed using 75 units of illumination from a UV light source at a distance of about 6 feet. A hydrophilic lithographic surface as described above in Example 12 is placed on the heated platen (100°C) of a press. The exposed element is brought into contact with the lithographic surface and the unexposed (non-crosslinked) polymer areas transferred under pressure to the lithographic surface. The transferred polymer is then crosslinked (fixed) by exposure thereof to 75 units of illumination from a UV light source. The resultant plate is placed on a lithographic printing press and approximately 200 prints prepared. No significant degradation of the master is noted.

The invention has been described with particular reference to preferred embodiments thereof but it will be understood that variations and modifications can be effected within the spirit and scope of the invention.

I claim:

1. A lithographic element comprising a support having thereon a layer having a hydrophilic surface, said layer comprising a crosslinked material that is substantially free from discrete particles and comprises hydrolyzed polyvinyl acetate crosslinked with hydrolyzed tetraethylorthosilicate, said element having thereon an image-bearing layer or an image forming layer.

2. A lithographic element as described in claim 1 wherein the layer having the hydrophilic surface comprises a pigment.

3. A lithographic element as described in claim 2 wherein the pigment comprises titanium dioxide.

4. A lithographic element as described in claim 1 wherein said image-forming layer is a light-sensitive material.

5. A lithographic element as described in claim 4 wherein the light-sensitive material comprises a silver halide emulsion or a light-sensitive polymer.

6. A lithographic element as described in claim 1 wherein said image-forming layer comprises a silver precipitant.

7. A lithographic element as described in claim 6 wherein the silver precipitant comprises a mixture of nickel sulfide and silver iodide.

8. A lithographic element comprising a support having thereon a layer having a hydrophilic surface, the layer comprising (a) a crosslinked material that is substantially free from discrete particles and comprises hydrolyzed polyvinyl acetate crosslinked with hydrolyzed tetraethylorthosilicate and (b) a pigment, the element further comprising a silver precipitant located in a layer contiguous to said crosslinked material or located in said crosslinked material.

9. A lithographic element as described in claim 8 wherein the pigment comprises titanium dioxide.

10. A lithographic element as described in claim 1 wherein the support is selected from paper or aluminum.

11. A lithographic element as described in claim 10 wherein the paper is polyolefin coated paper.

12. A lithographic element as described in claim 1 wherein the hydrolyzed tetraethylorthosilicate is hyrolyzed with from 20 weight percent to 200 weight percent water.

13. A lithographic element as described in claim 1 wherein the hydrolyzed polyvinyl acetate is hydrolyzed with from 75 weight percent to 100 weight percent of water.

14. A lithographic element as described in claim 1 wherein the hydrolyzed tetraethylorthosilicate is hydrolyzed with from 20 weight percent to 200 weight percent of water and the hydrolyzed polyvinyl acetate is hydrolyzed with from 75 weight percent to 100 weight percent of water.

15. A lithographic element as described in claim 1 wherein the hydrolyzed tetraethylorthosilicate is present in said crosslinked material in an amount of from about 1 part by weight to about 50 parts by weight per part by weight of hydrolyzed polyvinyl acetate.

16. A lithographic element as described in claim 1 wherein the hydrolyzed tetraethylorthosilicate is present in said crosslinked material in an amount of from about 1.5 parts by weight to about 9 parts by weight per part by weight of hydrolyzed polyvinylacetate.

* * * * *

UNITED STATES PATENT AND TRADEMARK OFFICE
CERTIFICATE OF CORRECTION

PATENT NO. : 3,971,660
DATED : July 27, 1976
INVENTOR(S) : Henry C. Staehle

It is certified that error appears in the above-identified patent and that said Letters Patent are hereby corrected as shown below:

Column 1, line 60, "dryin" should read ---drying---.

Column 4, line 42, "hdyrophobic" should read ---hydrophobic---.

Column 5, line 56, "tetralkyl" should read ---tetraalkyl---.

Column 6, line 20, "hydrophosphite" should read ---hypophosphite---.

Column 7, line 31, "proces" should read ---process---.

Column 15, line 10, "crosslinking" should read ---crosslinker---. Line 30, "photocrosslinking" should read ---photocrosslinkable---.

Column 16, lines 39-40, "hyrolyzed" should read ---hydrolyzed---.

Signed and Sealed this

Twenty-third Day of November 1976

[SEAL]

Attest:

RUTH C. MASON
Attesting Officer

C. MARSHALL DANN
Commissioner of Patents and Trademarks